(12) United States Patent
Ying et al.

(10) Patent No.: US 12,130,674 B2
(45) Date of Patent: Oct. 29, 2024

(54) HARD DISK SUPPORTING STRUCTURE

(71) Applicants: Inventec (Pudong) Technology Corporation, Shanghai (CN); INVENTEC CORPORATION, Taipei (TW)

(72) Inventors: Yang Ying, Shanghai (CN); Xuefeng Chen, Shanghai (CN); Yanhua Shi, Shanghai (CN); Lisheng Wang, Shanghai (CN)

(73) Assignees: Inventec (Pudong) Technology Corporation, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 17/704,037

(22) Filed: Mar. 25, 2022

(65) Prior Publication Data

US 2024/0143047 A1 May 2, 2024

(30) Foreign Application Priority Data

Sep. 3, 2021 (CN) .......................... 202111029872.7

(51) Int. Cl.
*G06F 1/18* (2006.01)
*G11B 33/12* (2006.01)
*H05K 7/14* (2006.01)

(52) U.S. Cl.
CPC ............ *G06F 1/187* (2013.01); *G11B 33/125* (2013.01); *G11B 33/128* (2013.01); *G11B 33/126* (2013.01); *H05K 7/1489* (2013.01)

(58) Field of Classification Search
CPC .. H05K 7/1411; H05K 7/1489; H05K 7/1487; G06F 1/187; G11B 33/128; G11B 33/125; G11B 33/126
See application file for complete search history.

(56) References Cited

U.S. PATENT DOCUMENTS

| 3,028,209 | A  | * | 4/1962 | Hinkel | ................. | A47B 88/457 |
| | | | | | | 312/247 |
| 7,583,507 | B2 | * | 9/2009 | Starr | .................... | G11B 33/126 |
| | | | | | | 361/725 |
| 7,864,538 | B2 | * | 1/2011 | Wadsworth | .......... | H05K 7/1487 |
| | | | | | | 361/679.02 |
| 7,864,539 | B2 | * | 1/2011 | Dunham | ................. | G06F 1/187 |
| | | | | | | 361/679.02 |

(Continued)

FOREIGN PATENT DOCUMENTS

WO    WO-2019051989 A1  *  3/2019  ........... H05K 7/1487

*Primary Examiner* — Nidhi Thaker
(74) *Attorney, Agent, or Firm* — IPRTOP LLC

(57) ABSTRACT

A hard disk supporting structure is provided. The hard disk supporting structure includes a hard disk rack, a telescopic connecting rod, and a motor. The hard disk rack is for disposing at least one hard disk. An end of the telescopic connecting rod is connected to a rear end of the hard disk rack. The motor is connected to the other end of the telescopic connecting rod through a transmission mechanism; the motor drives the telescopic connecting rod to extend or retract through the transmission mechanism, to drive the hard disk rack to move back and forth. The present disclosure can automatically move the hard disk rack back and forth through a structure with automatic telescopic function, which saves labor, and improves efficiency.

8 Claims, 3 Drawing Sheets

(56) References Cited

U.S. PATENT DOCUMENTS

| | | | | |
|---|---|---|---|---|
| 7,916,423 B2* | 3/2011 | Starr | .................... | H05K 7/1487 360/92.1 |
| 8,009,385 B2* | 8/2011 | Starr | .................... | G11B 33/125 360/98.06 |
| 8,335,075 B2* | 12/2012 | Zhang | .................... | G06F 1/181 174/559 |
| 8,976,530 B2* | 3/2015 | Jeffery | ................ | G11B 33/128 361/728 |
| 9,025,326 B1* | 5/2015 | Xu | ....................... | G11B 33/128 361/679.33 |
| 9,030,827 B2* | 5/2015 | Jau | ....................... | H05K 7/1487 211/49.1 |
| 9,173,312 B1* | 10/2015 | Jau | ....................... | H05K 7/1487 |
| 9,462,721 B2* | 10/2016 | Jau | ....................... | G11B 33/128 |
| 10,080,307 B2* | 9/2018 | Zhang | ................ | H05K 7/1492 |
| 10,317,958 B1* | 6/2019 | Gao | ..................... | H05K 7/1425 |
| 10,383,242 B1* | 8/2019 | Chung | ................ | H05K 7/1487 |
| 10,383,247 B2* | 8/2019 | Chen | ...................... | G06F 1/187 |
| 10,945,349 B2* | 3/2021 | Wang | .................... | H05K 7/1487 |
| 11,464,131 B2* | 10/2022 | Russell | ................ | H05K 7/1487 |
| 11,737,221 B2* | 8/2023 | Tsorng | .................... | H05K 5/023 361/679.59 |
| 2005/0257232 A1* | 11/2005 | Hidaka | ................ | G11B 33/126 |
| 2007/0019379 A1* | 1/2007 | Hsiao | ..................... | G06F 1/184 361/679.01 |
| 2007/0230110 A1* | 10/2007 | Starr | .................... | H05K 7/1487 361/679.31 |
| 2008/0205007 A1* | 8/2008 | Yang | .................... | G07F 17/3216 361/725 |
| 2012/0134094 A1* | 5/2012 | Zhang | .................... | G06F 1/181 361/679.01 |
| 2015/0070830 A1* | 3/2015 | Iwasaki | ................ | H05K 7/1487 361/679.33 |
| 2015/0092340 A1* | 4/2015 | Jau | ....................... | H05K 7/1487 361/679.39 |
| 2022/0124933 A1* | 4/2022 | Li | ......................... | H05K 7/1489 |
| 2022/0377927 A1* | 11/2022 | Li | ......................... | G11B 33/126 |

* cited by examiner

HARD DISK SUPPORTING STRUCTURE

CROSS REFERENCE TO RELATED APPLICATION

This application claims the benefits of priority to Chinese Patent Application No. CN 2021110298722, entitled "Hard Disk Supporting Structure", filed with CNIPA on Sep. 3, 2021, the content of which is incorporated herein by reference in its entirety.

FIELD OF TECHNOLOGY

The present disclosure relates to the field of hard disks, and more specifically, to a hard disk supporting structure.

BACKGROUND

A hard disk rack is a structure for supporting hard disks. The hard disk rack may integrate multiple hard disks together for large-scale data storage. A conventional drawer hard disk rack needs to be pulled in or out manually. When the hard disk rack is long, this pull-in or pull-out operation requires more physical strength and time of the operator, thereby resulting in low work efficiency.

SUMMARY

The present disclosure provides a hard disk supporting structure, comprising: a hard disk rack, for disposing at least one hard disk; a telescopic connecting rod, wherein an end of the telescopic connecting rod is connected to a rear end of the hard disk rack; and a motor, connected to the other end of the telescopic connecting rod through a transmission mechanism; wherein the motor drives the telescopic connecting rod to extend or retract through the transmission mechanism, thereby driving the hard disk rack to move back and forth.

In an embodiment of the present disclosure, the hard disk supporting structure further comprises: a platform, for the motor and the transmission mechanism are fixed on the platform; wherein the hard disk rack moves back and forth on the platform.

In an embodiment of the present disclosure, the hard disk supporting structure further comprises: a shell, covered on the platform, wherein a holding space is formed between the shell and the platform; the holding space is for accommodating the hard disk rack, the telescopic connecting rod, and the motor.

In an embodiment of the present disclosure, an inner wall of the shell is slidably connected to an outer wall of the hard disk rack through a sliding rail.

In an embodiment of the present disclosure, the hard disk supporting structure further comprises: control button, disposed on a front outer wall of the hard disk rack; wherein the control button is electrically connected to the motor, and, by controlling the motor, controls the hard disk rack to move forward, to move backward, or stop.

In an embodiment of the present disclosure, the hard disk supporting structure further comprises: a winding slot, disposed on the platform of the hard disk supporting structure, for accommodating a connecting wire between the control button and the motor.

In an embodiment of the present disclosure, the winding slot comprises a crawler-type slot protruding from the platform; wherein a bottom of the hard disk rack is provided with a groove matched with the crawler-type slot.

In an embodiment of the present disclosure, the telescopic connecting rod comprises a scissor-type connecting rod.

In an embodiment of the present disclosure, the transmission mechanism comprises: a driving gear, disposed on an output shaft of the motor; a driven gear, engaging with the driving gear; and a rotating rod, running through the driven gear; wherein ends of the rotating rod are fixedly connected to a driving rod of the telescopic connecting rod.

In an embodiment of the present disclosure, the hard disk supporting structure further comprises: a front sliding slot and a rear sliding slot, fixed on a rear outer wall of the hard disk rack and a rear inner wall of the shell of the hard disk supporting structure respectively; wherein two ends of the telescopic connecting rod are slidably disposed in the front sliding slot and the rear sliding slot respectively.

As described above, the hard disk supporting structure in the present disclosure drives the hard disk rack to move back and forth by controlling the extension or contraction of the telescopic connecting rod, thereby automating the movement of the hard disk rack, reducing labor cost, and increasing efficiency. 000000

REFERENCE NUMERALS

Figure 1:
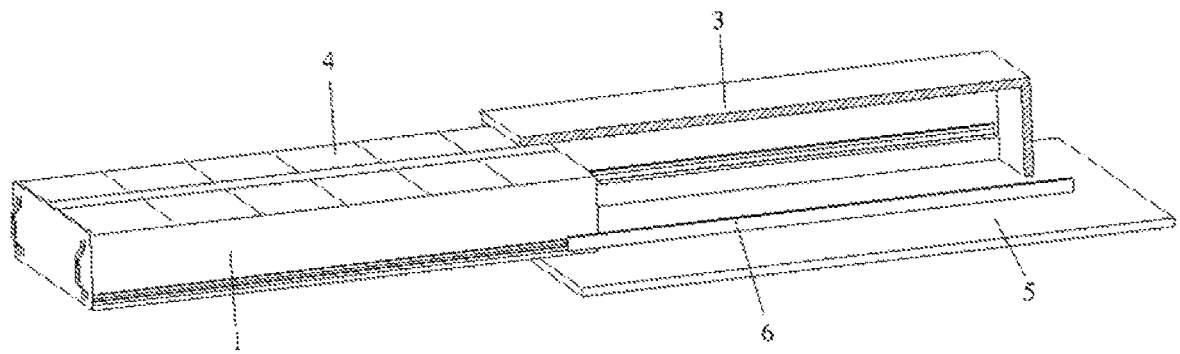
FIG. 1 is a schematic diagram of a hard disk supporting structure in the prior art.

1 Hard disk rack
2 Control button
3 Shell
4 Hard disk
5 Platform
6 Sliding rail
7 Telescopic connecting rod
8 Sliding slot
9 Rotating rod
10 Driven gear
11 Driving gear
12 Motor
13 Crawler-type slot
111 Driving rod of the telescopic connecting rod
112 Driven rod of the telescopic connecting rod
A Transmission mechanism

DETAILED DESCRIPTION

The embodiments of the present disclosure will be described below through specific examples. One skilled in the art can easily understand other advantages and effects of the present disclosure according to contents disclosed in the description. The present disclosure may also be implemented or applied through other different embodiments, and various modifications or changes may be made to all details in the description based on different points of view and applications without departing from the spirit of the present disclosure It needs to be stated that the drawings provided in these embodiments are just used for schematically describing the basic concept of the present disclosure, thus only illustrate components only related to the present disclosure and are not drawn according to the numbers, shapes and sizes of components during actual implementation, the configuration, number and scale of each component during actual implementation thereof may be freely changed, and the component layout configuration thereof may be more complex As shown in FIG. 1, a conventional drawer hard disk rack 1 is provided. The drawer hard disk rack 1 is disposed on a platform 5 and the drawer hard disk rack 1 carries multiple hard disks 4. The drawer hard disk rack 1 is slidably connected to a shell 3 through a sliding rail 6. The conventional rawer hard disk rack 1 needs to be pulled out from the shell 3 manually or to be pulled in the shell 3 manually, which is less automated. When more and more hard disks 4 are put on the hard disk rack 1, it takes more time and labor to pull in or pull out the hard disk rack 1. When the hard disk rack 1 gets longer, this pull-in or pull-out operation consumes more time and labor, thereby resulting in low efficiency.

In the present disclosure, a hard disk supporting structure is provided. The hard disk supporting structure, which is used to control a hard disk rack to move back and forth automatically, which reduces labor required and improves efficiency. The hard disk supporting structure will be described in detail below in combination with figures.

Figure 2:
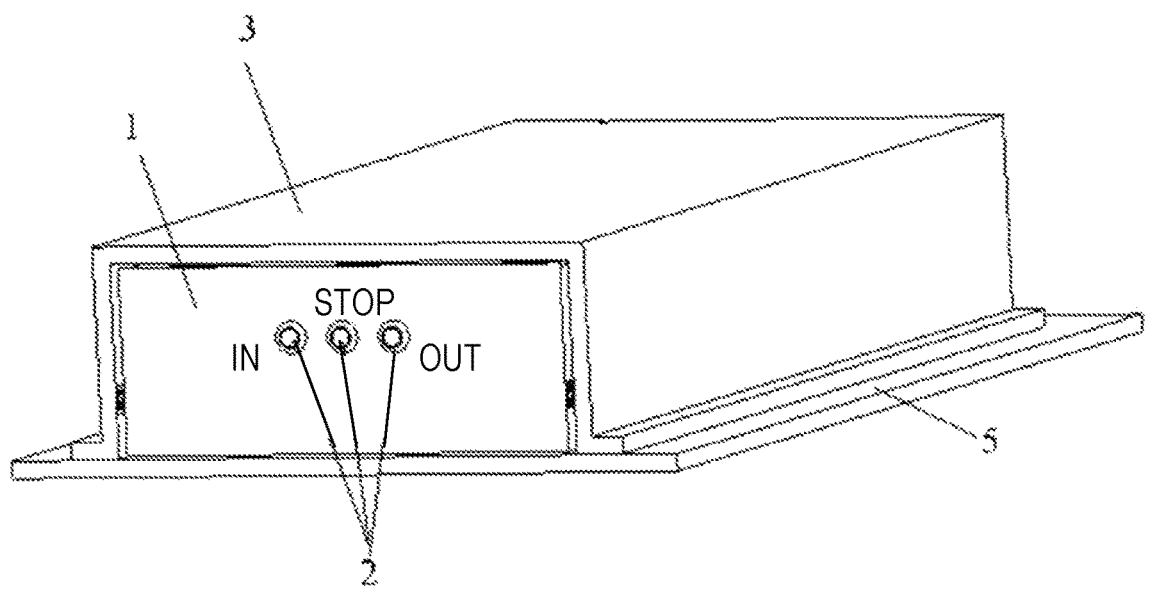
FIG. 2 is a schematic overall diagram of a hard disk supporting structure according to an embodiment of the present disclosure.

FIG. 2 is a overall schematic diagram of the hard disk supporting structure according to an embodiment of the present disclosure. FIG. 2 shows the external structure of the hard disk supporting structure. The hard disk supporting structure includes a hard disk rack 1, a control button 2, a shell 3, and a platform 5. The shell 3 is of a n-shape. The shell 3 is covered on the platform 5 and a holding space is formed between the platform 5 and the shell 3. The hard disk rack 1 is disposed in the holding space. In FIG. 2, the hard disk rack 1 is not pulled out from the shell 3 in FIG. 2. The control button 2 is disposed on the front outer wall of the hard disk rack 1. The control button 2 includes three buttons, for example, a "IN" button, an "OUT" button and a "STOP" button. When the "OUT" button is pressed by a user, the hard disk rack 1 moves forward. If the "STOP" button is pressed in the process of moving forward, then the hard disk rack 1 stops moving immediately. If the "IN" button is pressed in the process of moving forward, the hard disk rack 1 moves backward. Therefore, the hard disk rack 1 does not need to be pulled in or pulled out manually. That is, the hard disk rack 1 may move back and forth when buttons are pressed, which greatly reduces the workload.

Figure 3:
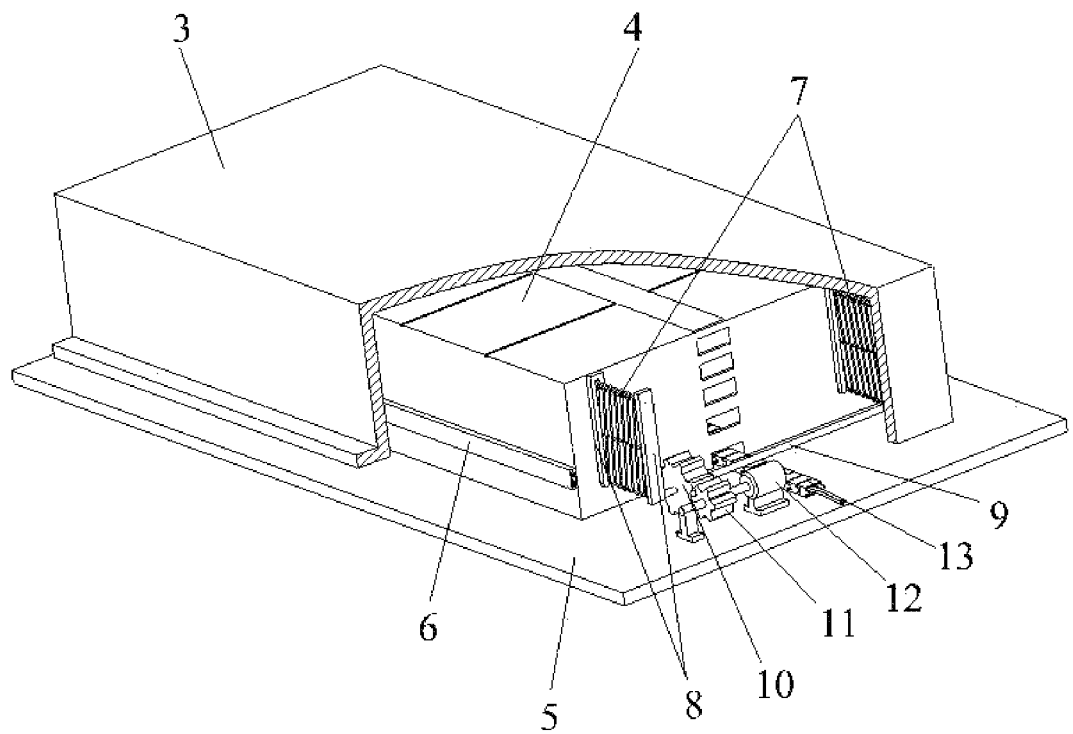
FIG. 3 is a schematic internal structural diagram of a hard disk supporting structure in FIG. 2 in a retracted state according to an embodiment of the present disclosure.

FIG. 3 is schematic internal structural diagram of the hard disk supporting structure in an retracted state in FIG. 2 according to an embodiment of the present disclosure. As shown in FIG. 3, the hard disk rack 1 is not pulled out from the shell 3. In an embodiment, the hard disk supporting structure includes the hard disk rack 1, a telescopic connecting rod 7, a transmission mechanism A, and a motor 12.

The hard disk rack 1 is for disposing at least one hard disk 4. Optionally, the hard disk rack 1 is divided into left and right columns by a slot portion. That is, the slot portion with a certain width is formed between the two columns. Multiple hard disks 4 are disposed in the two columns neatly.

An end of the telescopic connecting rod 7 is connected to a rear end of the hard disk rack 1, the other end of the telescopic connecting rod 7 is connected to the transmission mechanism A located at a bottom of the shell 3. Optionally, the telescopic connecting rod 7 is a scissor-type connecting rod, which looks like a scissor gate. The scissor-type connecting rod is disposed between a rear outer wall of the hard disk rack 1 and a rear inner wall of the shell 3 through a front sliding slot and a rear sliding slot (the sliding slot 8 includes the front sliding slot and the rear sliding slot).

Figure 4:
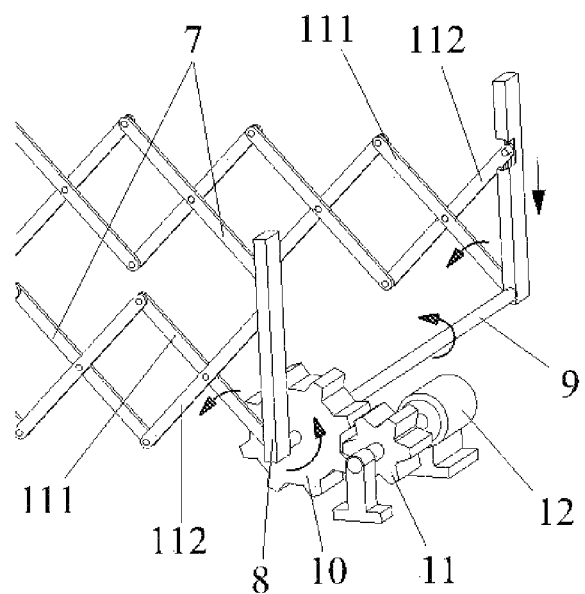
FIG. 4 is a schematic internal structural diagram of a transmission mechanism and a telescopic connecting rod according to an embodiment of the present disclosure.
Figure 5:
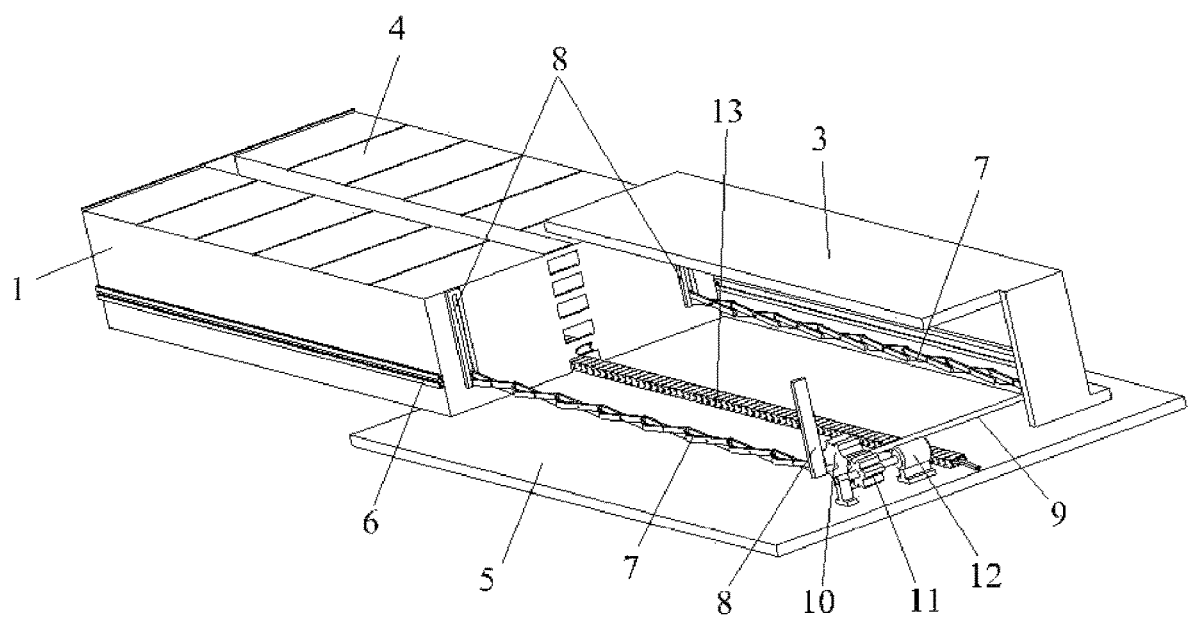
FIG. 5 is a schematic internal structural diagram of a hard disk supporting structure in FIG. 2 in an extended state shown according to an embodiment of the present disclosure

In an embodiment, FIG. 4 is a schematic internal structural diagram of the transmission mechanism A and the telescopic connecting rod 7 according to an embodiment of the present disclosure. The telescopic connecting rod 7 includes a driving rod 111 and a driven rod 112. Both a rear end of the driving rod and a rear end of the driven rod are located in the rear sliding slot. The rear end of the driving rod is located below the rear sliding slot and the position is fixed. The rear end of the driven rod slides up and down in the rear sliding slot when the telescopic connecting rod 7 retracts or extends. For example, from FIG. 3 to FIG. 4, the state of the telescopic connecting rod 7 changes from a fully retracted state to an extended state, and the rear end of the driven rod slides from the upper end of the rear sliding slot to the lower end of the rear sliding slot. It should be noted that, FIG. 4 only shows the rear end of the driving rod 111 and the rear end of the driven rod 112, and does not show a front end of the driving rod 111 and a front end of the driven rod 112. In the embodiment, both the structure and the motion principle of the front end of the driving rod 111 are consistent with those of the rear end of the driving rod 111, both the structure and the motion principle of the front end of the driven rod 111 are consistent with those of the rear end of the driven rod 111.

Referring to FIG. 3, the transmission mechanism A includes a driving gear 11, a driven gear 10, and a rotating rod 9. The driving gear 11 is engaged with the driven gear 10, the rotating rod 9 runs through the driven gear 10. As shown in FIG. 4, one end of the telescopic connecting rod 7 is connected to the transmission mechanism A, which means that ends of the rotating rod 9 and the rear end of the driving rod 111 of the telescopic connecting rod 7 are fixedly connected to the rear sliding slot. As shown by arrows in FIG. 4, when the driving gear 11 rotates clockwise, then the driving gear 111 drives the driven gear 10 to rotate counterclockwise, then the driven gear 10 drives the rotating rod 9 to rotate counterclockwise, then the rotating rod 9 drives the driving rod 111 to rotate counterclockwise, and finally the telescopic connecting rod 7 extends. In contrast, the counterclockwise rotation of the driving gear 11 will drive the telescopic connecting rod 7 to retract.

In the embodiment, the hard disk rack 1 is connected to the shell 3 through two telescopic connecting rods 7 that are set vertically, as shown in FIG. 3. The two telescopic connecting rods 7 are set vertically to save space. The two telescopic connecting rods 7 are set on the left and right sides of a winding slot 13 with their scissor panels in parallel and facing each other. For example, the two telescopic connecting rods 7 are set respectively between the rear outer wall of the hard disk rack 1 and the rear inner wall of the shell 3 through their corresponding front sliding slot and their corresponding rear sliding slot. The two ends of the rotating rod 9 and the rear ends of the driving rods 111 of the two telescopic connecting rods 7 are fixedly connected to two sliding slots. The above setting enables the hard disk rack 1 to move back and forth steadily.

Still referring to FIG. 3, the motor 12 is connected to an end of the telescopic connecting rods 7 through the transmission mechanism A. In an embodiment, the driving gear 11 of the transmission mechanism A is disposed on an output shaft of the motor 12. Rotation of the motor 12 drives the driving gear 11 and the driven gear 10 to rotate, then the rotation rod 9 drives the driving rod 111 of the telescopic connecting rod 7 to rotate, thereby enabling the telescopic connecting rod 7 to extend or retract, and finally the hard disk rack 1 may move back and forth.

In addition, the control button 2 is electrically connected to the motor 12. That is, the control button 2 is connected to the motor 12 through connecting wires. In an embodiment, thrune bottom of the slot portion of the hard disk rack 1 is provided with a groove along the length direction of the hard disk rack 1. A crawler-type slot 13 is set on the platform 5. And crawler-type slot 13 is matched with the groove. The crawler-type slot 13 is for storing the connecting wires between the control button 2 and the motor 12. In an embodiment, the crawler-type slot 13 protrudes from the platform 5. When the hard disk rack 1 moves back and forth, the hard disk rack 1 is not in contact with the groove of the hard disk rack 1. The above structure ensures that these connecting wires will not be worn when the hard disk rack 1 moves back and forth.

Still referring to FIG. 3, an inner wall (e.g., a left inner wall and a right inner wall) of the shell 3 is slidably connected to an outer side wall (e.g., a left outer wall and a right outer wall) of the hard disk rack 1 through a sliding rail 6, to ensure the stability of hard disk rack 1 in the process of moving back and forth.

The principle of controlling the forward and backward movement and stopping of the hard disk rack 1 by controlling the motor 12 will be described in detail below.

As shown in FIG. 3, the hard disk rack 1 is pulled out from the shell 3 totally. When the "OUT" button is pressed, the motor 12 rotates clockwise, then the motor 12 drives the driving gear 11 to rotate clockwise, then the driving gear 11 drives the driven gear 10 to rotate counterclockwise, then the driven gear 10 drives the rotating rod 9 to rotate counterclockwise, then the rotating rod 9 drives the driving rod 111 to rotate counterclockwise, and finally the telescopic connecting rod 7 starts to extend to enable the hard disk rack 1 to move outward. If no other buttons are pressed during the above process, the hard disk rack 1 will continue to move outward until the extension of the telescopic connecting rod 7 reaches a limit, that is, when, as shown in FIG. 4, the hard disk rack 1 is entirely pulled out from the holding space by the telescopic connecting rod 7. If the "STOP" button is pressed during the above outward movement of the hard disk rack 1, the motor 12 stops rotating, and then the hard disk rack 1 also stops moving. If the "IN" button is pressed during the above outward movement of the hard disk rack 1, the motor 12 rotates counterclockwise, then the motor 12 drives the driving gear 11 to rotate counterclockwise, then the driving gear 11 drives the driven gear 10 to rotate clockwise, then the driven gear 10 drives the rotating rod 9 to rotate clockwise, then the rotating rod 9 drives the driving rod 111 to rotate clockwise, and finally the telescopic connecting rod 7 starts to retract to enable the hard disk rack 1 to move inward. If no other buttons are pressed during the above process, the hard disk rack 1 will continue to move inward until the retraction of the telescopic connecting rod 7 reaches a limit, that is, when, as shown in FIG. 3, the hard disk rack 1 is entirely in the holding space.

As described above, the present disclosure can automatically move the hard disk rack back and forth through a structure with automatic telescopic function, which greatly saves labor, and improves efficiency. In summary, the present disclosure effectively overcomes various defects in the prior art and has a high industrial value.

The above-mentioned embodiments are merely illustrative of the principle and effects of the present disclosure instead of limiting the present disclosure. Modifications or variations of the above-described embodiments may be made by those skilled in the art without departing from the spirit and scope of the present disclosure. Therefore, all equivalent modifications or changes made by those who have common knowledge in the art without departing from the spirit and technical concept disclosed by the present disclosure shall be still covered by the claims of the present disclosure.

What is claimed is:

1. A hard disk supporting structure, comprising:
   a hard disk rack, for disposing at least one hard disk;
   a telescopic connecting rod, wherein a first end of the telescopic connecting rod is connected to a rear end of the hard disk rack; and
   a motor, connected to a second end of the telescopic connecting rod through a transmission mechanism; wherein the motor drives the telescopic connecting rod to extend or retract through the transmission mechanism, thereby driving the hard disk rack to move back and forth,
   wherein the telescopic connecting rod comprises a scissor-type connecting rod,
   wherein the transmission mechanism comprises:
   a driving gear, disposed on an output shaft of the motor;
   a driven gear, engaging with the driving gear; and
   a rotating rod, running through the driven gear; wherein ends of the rotating rod are fixedly connected to a driving rod of the telescopic connecting rod.

2. The hard disk supporting structure as in claim 1, further comprising:
   a platform, wherein the motor and the transmission mechanism are fixed to the platform; wherein the hard disk rack moves back and forth on the platform.

3. The hard disk supporting structure as in claim 2, further comprising:
   a shell, covered on the platform, wherein a holding space is formed between the shell and the platform; the holding space is for accommodating the hard disk rack, the telescopic connecting rod, and the motor.

4. The hard disk supporting structure as in claim 3, wherein an inner wall of the shell is slidably connected to an outer wall of the hard disk rack through a sliding rail.

5. The hard disk supporting structure as in claim 1, further comprising:
   a control button, disposed on the front outer wall of the hard disk rack; wherein the control button is electrically connected to the motor, and, by controlling the motor, controls the hard disk rack to move forward, move backward, or stop moving.

6. The hard disk supporting structure as in claim 5, further comprising:
   a winding slot, disposed on the platform of the hard disk supporting structure, for accommodating a connecting wire between the control button and the motor.

7. The hard disk supporting structure as in claim 6, wherein the winding slot comprises a crawler-type slot protruding from the platform; wherein a bottom of the hard disk rack is provided with a groove matched with the crawler-type slot.

8. The hard disk supporting structure as in claim 1, further comprising:
a front sliding slot and a rear sliding slot, fixed on a rear outer wall of the hard disk rack and a rear inner wall of a shell of the hard disk supporting structure respectively; wherein two ends of the telescopic connecting rod are slidably disposed in the front sliding slot and the rear sliding slot respectively.

* * * * *